(12) United States Patent
Cheng

(10) Patent No.: US 9,793,327 B2
(45) Date of Patent: Oct. 17, 2017

(54) ARRAY SUBSTRATE, DISPLAY DEVICE HAVING THE SAME, AND METHOD THEREOF

(71) Applicant: BOE TECHNOLOGY GROUP CO., LTD., Beijing (CN)

(72) Inventor: Jun Cheng, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/037,883

(22) PCT Filed: Dec. 10, 2015

(86) PCT No.: PCT/CN2015/096939
§ 371 (c)(1),
(2) Date: May 19, 2016

(87) PCT Pub. No.: WO2016/188086
PCT Pub. Date: Dec. 1, 2016

(65) Prior Publication Data
US 2017/0110525 A1    Apr. 20, 2017

(30) Foreign Application Priority Data

May 28, 2015  (CN) .......................... 2015 1 0284467

(51) Int. Cl.
*H01L 27/32* (2006.01)
*H01L 27/12* (2006.01)

(52) U.S. Cl.
CPC ...... *H01L 27/3248* (2013.01); *H01L 27/3262* (2013.01); *H01L 27/3267* (2013.01);
(Continued)

(58) Field of Classification Search
CPC ............. H01L 27/3248; H01L 27/3262; H01L 27/3267; H01L 27/3276
See application file for complete search history.

(56) References Cited

U.S. PATENT DOCUMENTS

2004/0239658 A1* 12/2004 Koyama .................. G09G 3/32
                                                        345/204
2005/0093767 A1*  5/2005 Lu ........................ H01L 27/3225
                                                        345/1.1
(Continued)

FOREIGN PATENT DOCUMENTS

CN         1670981 A      9/2005
CN         1739130 A      2/2006
(Continued)

OTHER PUBLICATIONS

International Search Report & Written Opinion dated Mar. 21, 2016 regarding PCT/CN2015/096939.
(Continued)

*Primary Examiner* — Allan R Wilson
(74) *Attorney, Agent, or Firm* — Intellectual Valley Law, P.C.

(57) ABSTRACT

The present application discloses an array substrate comprising a pixel unit comprising a bottom emitting organic light emitting diode, a top emitting organic light emitting diode, a first drive thin film transistor, and a second drive thin film transistor. The first drive thin film transistor is connected to the bottom emitting organic light emitting diode for driving the bottom emitting organic light emitting diode to emit light. The second drive thin film transistor is connected to the top emitting organic light emitting diode for driving the top emitting organic light emitting diode to emit light.

20 Claims, 4 Drawing Sheets

(52) U.S. Cl.
CPC ........ *H01L 27/3276* (2013.01); *H01L 27/124* (2013.01); *H01L 2227/323* (2013.01); *H01L 2251/5323* (2013.01)

(56) References Cited

U.S. PATENT DOCUMENTS

| | | | |
|---|---|---|---|
| 2006/0038752 A1* | 2/2006 | Winters | G09G 3/3225 345/76 |
| 2008/0304248 A1* | 12/2008 | Jin | H01L 27/3267 362/19 |
| 2012/0086655 A1 | 4/2012 | Wang et al. | |
| 2013/0193843 A1* | 8/2013 | Yan | H05B 33/22 313/504 |

FOREIGN PATENT DOCUMENTS

| | | |
|---|---|---|
| CN | 102044554 A | 5/2011 |
| CN | 103227186 A | 7/2013 |
| CN | 103325318 A | 9/2013 |
| CN | 104851893 A | 8/2015 |

OTHER PUBLICATIONS

First Office Action in the Chinese Patent Application No. 201510284467.8, dated May 2, 2017; English translation attached.

\* cited by examiner

ARRAY SUBSTRATE, DISPLAY DEVICE HAVING THE SAME, AND METHOD THEREOF

CROSS-REFERENCE TO RELATED APPLICATION

This application is a national stage application under 35 U.S.C. §371 of International Application No. PCT/CN2015/096939 filed Dec. 10, 2015, which claims priority to Chinese Patent Application No. 201510284467.8, filed May 28, 2015, the contents of which are incorporated by reference in the entirety.

FIELD

The present invention relates to display technology, more particularly, to an array substrate, a display device having the same, and a manufacturing method thereof.

BACKGROUND

Conventional display devices are single sided. For applications that require display on both sides of the display, usually two independent display panels are stacked together back to back. This type of dual-side display device requires two independent driver systems for image display on both sides, resulting in high manufacture costs and increased panel thickness.

SUMMARY

In one aspect, the present invention provides an array substrate comprising a pixel unit comprising a bottom emitting organic light emitting diode, a top emitting organic light emitting diode, a first drive thin film transistor, and a second drive, thin film transistor. The first drive thin film transistor is connected to the bottom emitting organic light emitting diode for driving the bottom emitting organic light emitting diode to emit light. The second drive thin film transistor is connected to the top emitting organic light emitting diode for driving the top emitting organic light emitting diode to emit light.

Optionally, the array substrate further comprises at least one switching unit and at least one data line. The at least one switching unit is connected and adapted to control the first drive thin film transistor and the second drive thin film transistor, the first drive thin film transistor is connected to the at least one data line, and adapted to transmit a signal from the at least one data line to the bottom emitting organic light emitting diode, and the second drive thin film transistor is connected to the at least one data line, and adapted to transmit a signal from the at least one data line, to the top emitting organic light emitting diode.

Optionally, the at least one switching unit is an at least one switch thin film transistor, and the at least one data line comprises a first data line and a second data line, the first drive thin film transistor is connected to the first data line, and adapted to transmit a signal from the first data line to the bottom emitting organic light emitting diode, and the second drive thin film transistor is connected to the second data line, and adapted to transmit a signal from the second data line to the top emitting organic light emitting diode.

Optionally, the array substrate further comprises a third data line connected to a source electrode of the at least one switch thin film transistor; and at least one gate line connected to a gate electrode of the at least one switch thin film transistor. A drain electrode of the first drive thin film transistor is connected to a first electrode of the bottom emitting organic light emitting diode, a source electrode of the first drive thin film transistor is connected to the first data line; a drain electrode of the second drive thin film transistor is connected to a third electrode of the top emitting organic light emitting diode, a source electrode of the second drive thin film transistor is connected to the second data line; and the at least one switch thin film transistor is adapted to provide gate electrode signals to the first drive thin film transistor and the second drive thin film transistor.

Optionally, the at least one switch thin film transistor comprises a first switch thin film transistor, the first switch thin film transistor is connected to and adapted to control the first drive thin film transistor and the second drive thin film transistor, and the at least one gate line comprises a first gate line; the gate electrode of the first switch thin film transistor is connected to the first gate line; the source electrode of the first switch thin film transistor is connected to the third data line; and the drain electrode of the first switch thin film transistor is connected to a gate electrode of the first drive thin film transistor and a gate electrode of the second drive thin film transistor.

Optionally, the first data line and the second data line are dispose on two sides of the pixel unit, the first data line is proximal to the first drive thin film transistor and the second data line is proximal to the second drive thin film transistor; the third data line is proximal to the first data line or the second data line; the first data line and the second data line are substantially parallel to each other and on a same layer as the source electrodes and the drain electrodes of the first switch thin film transistor, the first drive thin film transistor and the second drive thin film transistor; and the first gate line is on a same layer as the gate electrodes of the first switch thin film transistor, the first drive thin film transistor and the second drive thin film transistor.

Optionally, the at least one switch thin film transistor comprises a first switch thin film transistor and a second switch thin film transistor, the first switch thin film transistor is connected to and adapted to control the first drive thin film transistor, the second switch thin film transistor is connected to and adapted to control the second drive thin film transistor; the gate electrode of the first switch thin film transistor and the gate electrode of the second switch thin film transistor are connected to the at least one gate line; the source electrode of the first switch thin film transistor is connected to the third data line, the source electrode of the second switch thin film transistor is connected to a fourth data line; and the drain electrode of the first switch thin film transistor is connected to a gate electrode of the first drive thin film transistor, the drain electrode of the second switch thin film transistor is connected to a gate electrode of the second drive thin film transistor.

Optionally, the at least one gate line comprises a first gate line and a second gate line, the gate electrode of the first switch thin film transistor is connected to the first gate line, and the gate electrode of the second switch thin film transistor is connected to the second gate line.

Optionally, the first data line and the second data line are dispose on two sides of the pixel unit, the first data line is proximal to the first drive thin film transistor and the second data line is proximal to the second drive thin film transistor; the third data line is proximal to the first data line, the fourth data line is proximal to the second data line; the first data line and the second data line are substantially parallel to each other and on a same layer as the source electrodes and the drain electrodes of the first switch thin film transistor, the second switch, thin film transistor, the first drive thin film transistor and the second drive thin film transistor; the third data line and the fourth data line are on a same layer; and the first gate line is on a same layer as the gate electrodes of the first switch thin film transistor, the second switch thin film transistor, the first drive thin film transistor and the second drive thin film transistor.

Optionally, the first electrode of the bottom emitting organic light emitting diode is proximal to the drain electrode of the first drive thin film transistor, a second electrode of the bottom emitting organic light emitting diode is distal to the drain electrode of the first drive thin film transistor, the first electrode is a transparent electrode, and the second electrode is a semi-transparent electrode; the third electrode of the top emitting organic light emitting diode is proximal to the drain electrode of the second drive thin film transistor, a fourth electrode of the top emitting organic light emitting diode is distal to the drain electrode of the first drive thin film transistor, the third electrode is a transparent electrode, and the fourth electrode is a semi-transparent electrode; and the top emitting organic light emitting diode further comprises a reflective layer on a side of the third electrode distal to the fourth electrode.

In another aspect, the present invention also provides a method of manufacturing an array substrate comprising a pixel unit. The method comprises forming a bottom emitting organic light emitting diode, a top emitting organic light emitting diode, a first drive thin film transistor, and a second drive thin film transistor in the pixel unit. The first drive thin film transistor is connected to the bottom emitting organic light emitting diode for driving the bottom emitting organic light emitting diode to emit light. The second drive thin film transistor is connected to the top emitting organic light emitting diode for driving, the top emitting organic light emitting diode to emit light.

Optionally, the method further comprises forming at least one switching unit and at least one data line in the pixel unit. The at least one switching unit is connected and adapted to control the first drive thin film transistor and the second drive thin film transistor, the first drive thin film transistor is connected to the at least one data line, and adapted to transmit a signal from the at least one data line to the bottom emitting organic light emitting diode, and the second drive thin film transistor is connected to the at least one data line, and adapted to transmit a signal from the at least one data line to the top emitting organic light emitting diode.

Optionally, the at least one switching unit is an at least one switch thin film transistor, the at least one data line comprises a first data line and a second data line; the first drive thin film transistor is connected to the first data line, and adapted to transmit a signal from the first data line to the bottom emitting organic light emitting diode, and the second drive thin film transistor is connected to the second data line, and adapted to transmit a signal from the second data line to the top emitting organic light emitting diode.

Optionally, the method further comprises forming a third data line connected to a source electrode of the switch thin film transistor; and forming at least one gate line connected to a gate electrode of the at least one switch thin film transistor. A drain electrode of the first drive thin film transistor is connected to a first electrode of the bottom emitting organic light emitting diode, a source electrode of the first drive thin film transistor is connected to the first data line; a drain electrode of the second drive thin film transistor is connected to a third electrode of the top emitting organic light emitting diode, a source electrode of the second drive thin film transistor is connected to the second data line; and the at least one switch thin film transistor is adapted to provide gate electrode signals to the first drive thin film transistor and the second drive thin film transistor.

Optionally, the at least one switch thin film transistor comprises a first switch thin film transistor, the first switch thin film transistor is connected to and adapted to control the first drive thin film transistor and the second drive thin film transistor, and the at least one gate line comprises a first gate line; the gate electrode of the first switch thin film transistor is connected to the first gate line; the source electrode of the first switch thin film transistor is connected to the third data line; and the drain electrode of the first switch thin film transistor is connected to a gate electrode of the first drive thin film transistor and a gate electrode of the second drive thin film transistor.

Optionally, the first data line and the second data line are disposed on two sides of the pixel unit, the first data line is formed proximal to the first drive thin film transistor and the second data line is formed proximal to the second drive thin film transistor; the third data line is formed proximal to the first data line or the second data line; the first data line and the second data line are substantially parallel to each other and formed in a same patterning process as the source electrodes and the drain electrodes of the first switch thin film transistor, the first drive thin film transistor and the second drive thin film transistor; and the first gate line is formed in a same patterning process as the gate electrodes of the first switch thin film transistor, the first drive thin film transistor and the second drive thin film transistor.

Optionally, the at least one switch thin film transistor comprises a first switch thin film transistor and a second switch thin film transistor, the first switch thin film transistor is connected to and adapted to control the first drive thin film transistor, the second switch thin film transistor is connected to and adapted to control the second drive thin film transistor; the gate electrode of the first switch thin film transistor and the gate electrode of the second switch thin film transistor are connected to the at least one gate line; the source electrode of the first switch thin film transistor is connected to the third data line, the source electrode of the second switch thin film transistor is connected to the fourth data line; and the drain electrode of the first switch thin film transistor is connected to a gate electrode of the first drive thin film transistor, the drain electrode of the second switch thin film transistor is connected to a gate electrode of the second drive thin film transistor.

Optionally, the at least one gate line comprises a first gate line and a second gate line, the gate electrode of the first switch thin film transistor is connected to the first gate line, and the gate electrode of the second switch thin film transistor is connected to the second gate line.

Optionally, the first data line and the second data line are dispose on two sides of the pixel unit, the first data line is formed proximal to the first drive thin film transistor and the second data line is thrilled proximal to the second drive thin film transistor; the third data line is formed proximal to the first data line, the fourth data line is formed proximal to the second data line; the first data line and the second data line are substantially parallel to each other and formed in a same patterning process as the source electrodes and the drain electrodes of the first switch thin film transistor, the second switch thin film transistor, the first drive thin film transistor and the second drive thin film transistor; the third data line and the fourth data line are formed in a same patterning process as the first data line and the second data line; and the first gate line is formed in a same patterning process as the gate electrodes of the first switch thin film transistor, the second switch thin film transistor, the first drive thin film transistor and the second drive thin film transistor.

Optionally, the step of forming a bottom emitting organic light emitting diode and a top emitting organic light emitting diode in each of the plurality of pixel units comprises sequentially forming a transparent first electrode, a first organic material function layer, a semi-transparent second electrode in a first area of each of the plurality of pixel units; sequentially forming a transparent third electrode, a second organic material function layer, a semi-transparent fourth electrode in a second area of each of the plurality of pixel units; and forming a reflective layer on a side of the third electrode distal to the fourth electrode in the second area.

In another aspect, the present invention further provides a display device comprising an array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
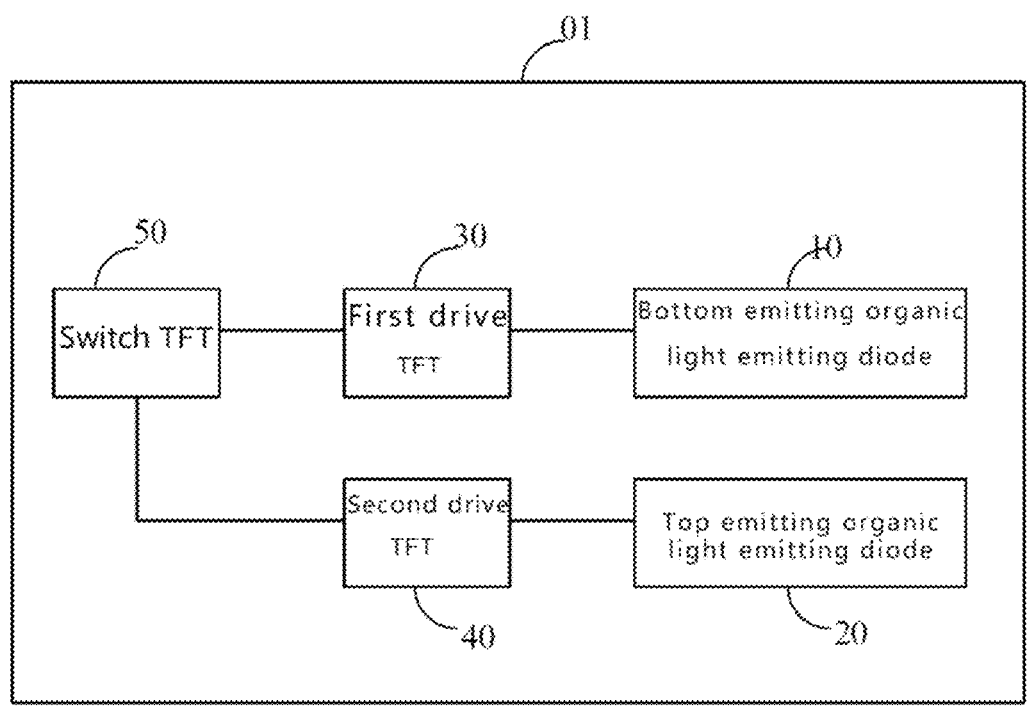
FIG. 1 is a schematic view of a connection of various components in a pixel unit of an array substrate in an embodiment.
Figure 2:
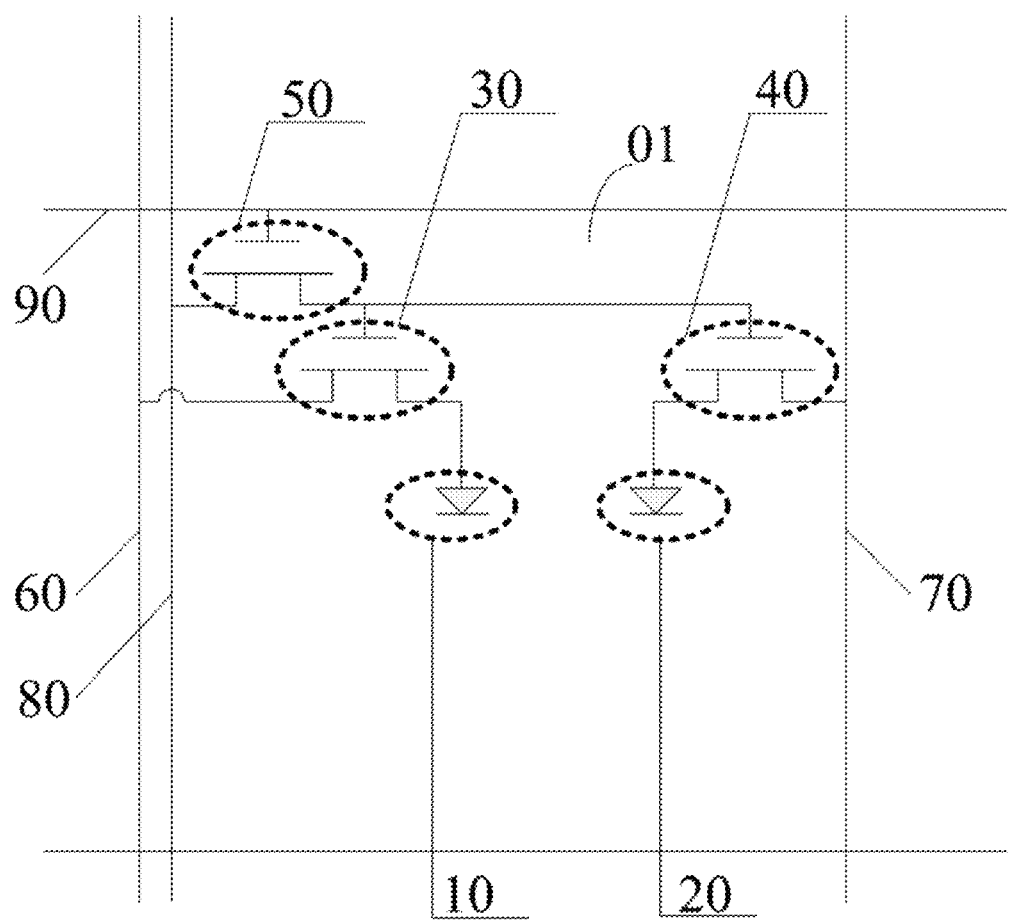
FIG. 2 is a schematic view of a connection of various components in a pixel unit of an array substrate in another embodiment.
Figure 3:
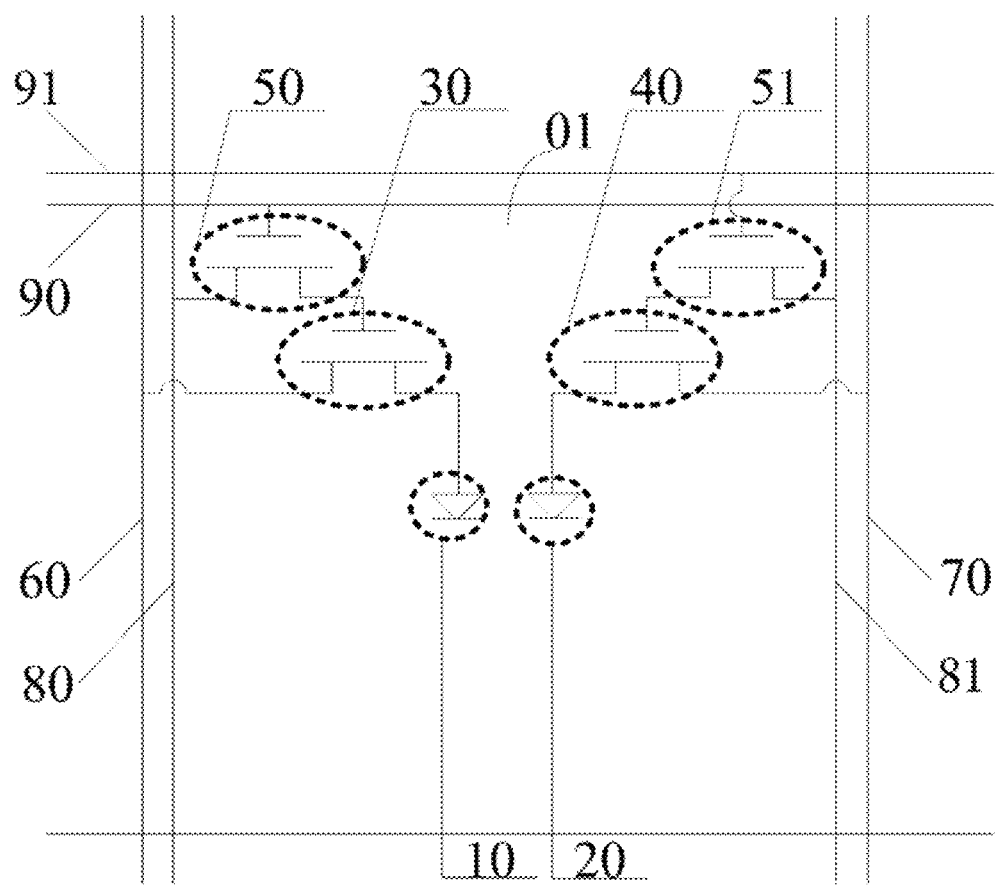
FIG. 3 is a schematic view of a connection of various components in a pixel unit of an array substrate in another embodiment.

FIGS. 1-3 show the connection of various components in a pixel unit of an array substrate in some embodiments. Referring to FIGS. 1-3, the array substrate in the embodiments include a base substrate, at least one data line (e.g., a first data line 60 and a second data line 70), and an array of a plurality of pixel units 01 on the base substrate. Each of the plurality of pixel units 01 includes a bottom emitting organic light emitting diode 10, a top emitting organic light emitting diode 20, a first drive thin film transistor 30, a second drive thin film transistor 40. The first drive thin film transistor 30 is connected to the bottom emitting organic light emitting diode 10 for driving the bottom emitting organic light emitting diode 10 to emit light. The second drive thin film transistor 40 is connected to the top emitting organic light emitting diode 20 for driving the top emitting organic light emitting diode 20 to emit light.

In some embodiments, the pixel unit includes at least one (e.g., one or two or more) switching unit 50 (e.g., a switch thin film transistor or a switching diode). The at least one switching unit 50 is connected to and adapted to control the first drive thin film transistor 30 and the second drive thin film transistor 40. Optionally, the switching unit 50 is a switch thin film transistor 50. Optionally, each of the plurality of pixel units 01 comprises only one switching unit (e.g., switch thin film transistor 50). Optionally, each of the plurality of pixel units 01 comprises only two switching units (e.g., two switch thin film transistors 50).

In some embodiment, the at least one data line includes two different data lines, e.g., the first data line 60 and the second data line 70. Optionally, the first drive thin film transistor 30 is connected to the first data line 60, and adapted to transmit a signal from the first data line 60 to the bottom emitting organic light emitting diode 10. Optionally, the second drive thin film transistor 40 is connected to the second data line 70, and adapted to transmit a signal from the second data line 70 to the top emitting organic light emitting diode 20.

In some embodiment, the at least one data line includes one data line. Optionally, the first drive thin film transistor 30 and the second drive thin film transistor 40 are both connected to a same data line, the first drive thin film transistor 30 is adapted to transmit a signal from the same data line to, the bottom emitting organic light emitting diode 10, and the second drive thin film transistor 40 is adapted to transmit a signal from the same data line to the top emitting organic light emitting diode 20.

The bottom emitting organic light emitting diode 10 and the top emitting organic light emitting diode 20 emit light in different directions, e.g., opposite directions. For example, the bottom emitting organic light emitting diode 10 emits light from a first side of the base substrate, and the top emitting organic light emitting diode 20 emits light from a second side of the base substrate. Optionally, the second side is a side opposite to the first side. In some embodiments, the bottom emitting organic light emitting diode 10 emits light and is viewed through the base substrate upon which it is based. In some embodiments, the top emitting organic light emitting diode 20 primarily emits light and is viewed through the side opposite to the base substrate. Optionally, the top emitting organic light emitting diode 20 does not primarily emit light through the base substrate. For example, in a dual-side display device including such an array substrate, the first drive thin film transistor 30 transmits drive signals to the bottom emitting organic light emitting diode 10, an image is displayed on one side of the display device. The second drive thin film transistor 40 transmits drive signals to the top emitting organic light emitting diode 20, an image is display on the opposite side of the display device.

Each of the bottom emitting organic light emitting diode 10 and the top emitting organic light emitting diode 20 includes two electrodes and an organic material functional layer sandwiched between two electrodes. The bottom emitting organic light emitting diode 10 optionally includes a first electrode, an organic material functional layer and a second electrode. The top emitting organic light emitting diode 20 optionally includes a third electrode, an organic material functional layer and a fourth electrode. The first, second, third, and fourth electrodes, and the organic material functional layer are disposed according to the light emitting directions of the bottom emitting organic light emitting diode 10 and the top emitting organic light emitting diode 20. Optionally, the bottom emitting organic light emitting diode 10 and the top emitting organic light emitting diode 20 further include additional functional layers to ensure their respective light emitting direction.

The organic material functional layer includes a light emitting layer, and may further include an electron transport layer and a hole transport layer. Optionally, the organic material functional layer further includes an electron injection layer between a cathode and the electron transport layer, and/or a hole injection layer between an anode and the hole transport layer, to enhance the efficiency of injection of electrons/holes into the light emitting layer.

The thin film transistors, for example, the first switch thin film transistor 50, the first drive thin film transistor 30 and the second drive thin film transistor 40, include a gate electrode, a gate insulating layer, a semi-conductor active layer, a source electrode and a drain electrode. The thin film transistors can be an N-type thin film transistor or a P-type thin film transistor.

The thin film transistors can be a top gate type thin film transistor or a bottom gate type thin film transistor. Optionally, they may be a non-crystalline silicone thin film transistor, a metal oxide thin film transistor, a low temperature polycrystalline silicone thin film transistor, or an organic thin film transistor.

Figure 4:
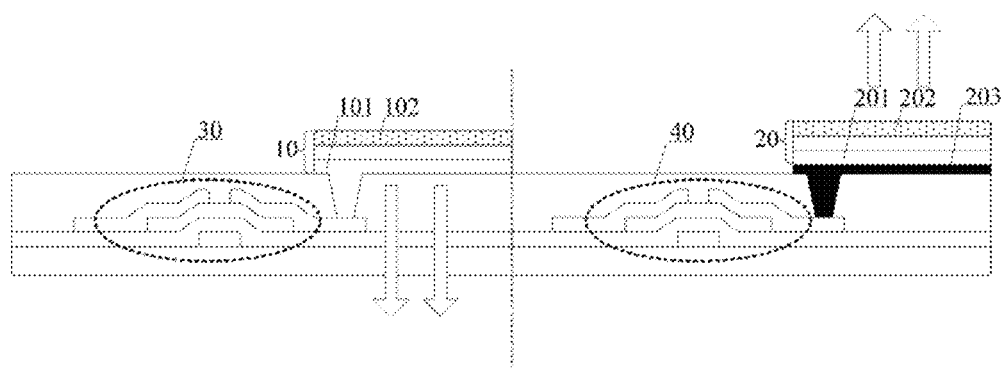
FIG. 4 is a diagram illustrating the structure of a pixel unit of an array substrate in an embodiment.

Referring to FIGS. 2-4, the drain electrode of the first drive thin film transistor 30 in the embodiments is connected to a first electrode of the bottom emitting organic light emitting diode, and the source electrode of the first drive thin film transistor 30 in the embodiments is connected to the first data line 60. Optionally, the drain electrode of the second drive thin film transistor 40 is connected to a third electrode of the top emitting organic light emitting diode 20, and the source electrode of the second drive thin film transistor 40 is connected to the second data line 70. Optionally, the at least one (e.g., one, two or more) switch thin film transistor 50 is adapted to provide gate electrode signals to the first drive thin film transistor 30 and the second drive thin film transistor 40. Optionally, the array substrate 01 further comprises a third data line 80 connected to a source electrode of the switch thin film transistor 50, and a first gate line 90 connected to a gate electrode of the at least one switch thin film transistor 50.

When the pixel unit has more than one switch thin film transistors, the source electrodes of switch thin film transistors are connected to different data lines. For example, when the pixel unit has two switch thin film transistors, the source electrode of the first switch thin film transistor 50 is connect to the third data line 80, and the source electrode of the second switch thin film transistor 51 is connected to the fourth data line 81. When the pixel unit has more than one switch thin film transistors, the gate electrodes of switch thin film transistors can be connected to at least one gate line (e.g., a same gate line or two different gate lines). Optionally, when the pixel unit has two switch thin film transistors, the gate electrode of the first switch thin film transistor 50 is connect to the first gate line 90, and the gate electrode of the second switch thin film transistor 51 is connected to the second gate line 91. Optionally, when the pixel unit has two switch thin film transistors, the gate electrode of the first switch thin film transistor 50 and the gate electrode of the second switch thin film transistor 51 are both connected to a same gate line. The number of switch thin film transistors determines the number of data lines connected to the switch thin film transistors. That is, the number of switch thin film transistors equals to the number of data lines connected to the switch thin film transistors.

In some embodiments, the number of switch thin film transistors is one (i.e., the first switch thin film transistor). Correspondingly, the gate electrode of the first switch thin film transistor 50 is connected to only one gate line, i.e., the gate line 90. The source electrode of the first thin film electrode 50 is connected to only one data line, i.e., the third data line 80. The drain electrode of the first switch thin film transistor 50 is connected to the gate electrodes of both the first drive thin film transistor 30 and the second drive thin film transistor 40.

Accordingly, one switch thin film transistor 50 can simultaneously control (e.g., turn on or turn off) the first drive thin film transistor 30 and the second drive thin film transistor 40 in a same pixel unit, thereby realize dual-side display in a display panel having the array substrate. Optionally, the first drive thin film transistor 30 and the second drive thin film transistor 40 connect to the first data line 60 and the second data line 70, respectively. Therefore, two sides of the display panel may display a same image or two different images. Further, the switch thin film transistors 50 from different pixel units of a single row in an array substrate connects to a same gate line 90.

In some embodiments, the first data line 60 and the second data line 70 are dispose on two sides of the pixel unit, the first data line 60 is proximal to the first drive thin film transistor 30 and the second data line 70 is proximal to the second drive thin film transistor 40. Optionally, the third data line 80 can be proximal to either the first data line 60 or the second data line 70. Optionally, the first data line 60 and the second data line 70 are substantially parallel to each other and on a same layer as the source electrodes and the drain electrodes of the first switch thin film transistor 50, the first drive thin film transistor 30 and the second drive thin film transistor 40. Optionally, the third data line 80 is spaced apart by a first insulating layer from the first data line 60 and the second data line 70. Optionally, the third data line 80 is on a same layer as the first data line 60 and the second data line 70. Optionally, the first gate line 90 is on a same layer as the gate electrodes of the first switch thin film transistor 50, the first drive thin film transistor 30 and the second drive thin film transistor 40.

As used herein, the term "same layer" refers to the relationship between the layers simultaneously formed in the same step. In one example, two electrodes are on the same layer when the two electrodes are formed as a result of one or more steps of a same patterning process performed on a same layer of material. In another example, the first data line 60 and the second data line 70 can be formed in the same layer by simultaneously performing the step of forming the first data line 60 and the step of forming the first data line 70. The term "same layer" does not always mean that the thickness of the layer or the height of the layer in a cross-sectional view is the same.

In some embodiments, the third data line 80 is connected to the source electrode of the first switch thin film transistor 50 through a via in the first insulating layer. The first data line 60 and the first drive thin film transistor 30 is directly connected. The second data line 70 and the second drive thin film transistor 40 is directly connected.

In some embodiments, the first data line 60 and the second data line 70 are on a same layer (i.e., formed in a same patterning process) as the source electrodes and the drain electrodes of the first switch thin film transistor 50, the first drive thin film transistor 30 and the second drive thin film transistor 40. Similarly, the first gate line 90 is on a same layer (i.e., formed in a same patterning process) as the gate electrodes of the first switch thin film transistor 50, the first drive thin film transistor 30 and the second drive thin film transistor 40. In addition, all active layers of the first switch thin film transistor 50, the first drive thin film transistor 30 and the second drive thin film transistor 40 may be formed in a same patterning process. Consequently, fewer patterning processes may be needed to form all the thin film transistors, data lines, and gate lines in the array substrate.

FIG. 3 is a schematic view of a connection of various components in a pixel unit of an array substrate in another embodiment. Referring to FIG. 3, the array substrate in the embodiment includes a first switch thin film transistor 50 and a second switch thin film transistor 51. The gate electrode of the first switch thin film transistor 50 is connected to the first gate line 90. The gate electrode of the second switch thin film transistor 51 is connected to a second gate line 91. The source electrode of the first switch thin film transistor 50 is connected to the third data line 80. The source electrode of the second switch thin film transistor 51 is connected to the fourth data line 81. The drain electrode of the first switch thin film transistor 50 is connected to a gate electrode of the first drive thin film transistor 30. The drain electrode of the second switch thin film transistor 51 is connected to a gate electrode of the second drive thin film transistor 40.

Referring to FIG. 3, the first switch thin film transistor 50 is connected to and adapted to control the first drive thin film transistor 30. The second switch thin film transistor 51 is connected to and adapted to control the second drive thin film transistor 40. Accordingly, the first drive thin film transistor 30 and the second drive thin film transistor 40 in a same pixel unit can be individually and separately controlled (e.g., turned on or turned off) by two switch thin film transistors 50 and 51, thereby realize dual-side display in a display panel having the array substrate. In such a display panel, two sides can display images at the same time. Alternatively, one side can display images while the other side does not. Optionally, the first drive thin film transistor 30 and the second drive thin film transistor 40 connect to the first data line 60 and the second data line 70, respectively. Therefore, two sides of the display panel may display a same image or two different images. Further, the switch thin film transistors 50 from different pixel units of a single row in an array substrate connects to a same gate line 90. The switch thin film transistors 51 from different pixel units of a single row in an array substrate connects to a same gate line 91. In FIG. 3, the first gate line 90 is a different gate line from the second gate line 91. As discussed above, in some embodiments, the first gate line 90 and the second gate line 91 can be a same gate line.

In some embodiments, the first data line 60 and the second data line 70 are disposed on two sides of the pixel unit. Optionally, the first data line 60 is proximal to the first drive thin film transistor 30 and the second data line 70 is proximal to the second drive thin film transistor 40. Optionally, the third data line 80 is proximal to the first data line 60, and the fourth data line 81 is proximal to the second data line 70. Optionally, the first data line 60 and the second data line 70 are substantially parallel to each other and on a same layer as the source electrodes and the drain electrodes of the first switch thin film transistor 50, the second switch thin film transistor 51, the first drive thin film transistor 30 and the second drive thin film transistor 40. Optionally, the third data line 80 and the fourth data line 81 are on a same layer. Optionally, the third data line 80 and the fourth data line 81 are spaced apart by a first insulating, layer from the first data line 60 and the second data line 70. Optionally, the first gate line 90 is spaced apart by a second insulating layer from the second gate line 70. Optionally, the first gate line 90 is on a same layer as the second gate line 70. Optionally, the first gate line 90 is on a same layer as the gate electrodes of the first switch thin film transistor 50, the second switch thin film transistor 51, the first drive thin film transistor 30 and the second drive thin film transistor 40.

In some embodiments, the third data line 80 is connected to the source electrode of the first switch thin film transistor 50 through a via in the first insulating layer. The first data line 60 and the first drive thin film transistor 30 is directly connected. The second data line 70 and the second drive thin film transistor 40 is directly connected. The gate electrode of the first switch thin film transistor 50 in a pixel unit is directly connected to the first gate line 90 on a same layer. The gate electrode of the second switch thin film transistor 51 in a pixel unit is connected to the second gate line 91 through a via in the second insulating layer.

FIG. 4 is a diagram illustrating the structure of a pixel unit of an array substrate in an embodiment. Referring to FIG. 4, the first electrode 101 of the bottom emitting organic light emitting diode 10 in the embodiment is proximal to the drain electrode of the first drive thin film transistor 30. The second electrode 102 of the bottom emitting organic light emitting diode 10 is distal to the drain electrode of the first drive thin film transistor 30. Optionally, the first electrode 101 is a transparent electrode. Optionally, the second electrode 102 is a semi-transparent electrode.

In some embodiments, the third electrode 201 of the top emitting organic light emitting diode 20 is proximal to the drain electrode of the second drive thin film transistor 40. Optionally, a fourth electrode 202 of the top emitting organic light emitting diode is distal to the drain electrode of the first drive thin film transistor 30. Optionally, the third electrode 201 is a transparent electrode. Optionally, the fourth electrode 202 is a semi-transparent electrode.

In some embodiments, the top emitting organic light emitting diode 20 further includes a reflective layer 203 on a side of the third electrode 201 distal to the fourth electrode 202.

Optionally, the transparent electrodes (e.g., the first electrode 101 and the third electrode 201) can be made of a high work function transparent material such as indium tin oxide and indium zinc oxide. Optionally, a metal electrode can be made of a low work function metal material such as silver. Optionally, the second electrode 102 or the fourth electrode 202 can be a semi-transparent metal layer which is relatively thin (such as Al, Cu, Mo, Ti, Pt, Ir, Ni, Cr, Ag, Au, W, or alloys thereof), or a semi-transparent layer including metal and transparent conductive materials (such as indium tin oxide (ITO), indium zinc oxide (IZO), aluminum zinc oxide (AZO), or zinc oxide (ZnO). Light transmission rate of a semi-transparent can be adjusted by, e.g., using a thin metal layer having different a thickness.

The electronic properties of thin film transistors can be enhanced by using high work function material for the first electrode 101 and the third electrode 201, and using low work function material for the second electrode 102 and the fourth electrode 202. To ensure that the top emitting light emitting diode 20 emits light in a direction opposite to that of the bottom emitting light emitting diode 10, a reflective layer 203 can be on a side of the third electrode 201 distal to the fourth electrode 202.

The reflective layer 203 can be made of a metal or other non-transparent and reflective materials. Optionally, the reflective layer 203 is made of a non-transparent and reflective metal. Optionally, the reflective layer 203 directly contacts the third electrode 201, and connects to the drain electrode of the second drive thin film transistor 40 through the third electrode 201. Optionally, the reflective layer 203 is not in contact with the third electrode 201.

Optionally, the first electrode 101 and the third electrode 201 are both made of transparent conductive material. Optionally, the first electrode 101 and the third electrode 201 are formed in a same patterning process. Optionally, the second electrode 102 and the fourth electrode 202 are both made of metal. Optionally, the second electrode 102 and the fourth electrode 202 are formed in a same patterning process.

In another aspect, the disclosure also provides a method of manufacturing an array substrate comprising a base substrate, at least one data line (e.g., a first data line 60 and a second data line 70), and an array of a plurality of pixel units 01 on the base substrate. In some embodiments, the method includes forming a bottom emitting organic light emitting diode 10, a top emitting organic light emitting diode 20, a first drive thin film transistor 30, and a second drive thin film transistor 40. The first drive thin film transistor 30 is connected to the bottom emitting organic light emitting diode 10 for driving the bottom emitting organic light emitting diode 10 to emit light. The second drive thin film transistor 40 is connected to the top emitting organic light emitting diode 20 for driving the top emitting organic light emitting diode 20 to emit light.

In some embodiments, the method further includes forming at least one (e.g., one or two or more) switching unit 50 (e.g., a switch thin film transistor or a switching diode). The at least one switching unit 50 is connected to and adapted to control the first drive thin film transistor 30 and the second drive thin film transistor 40. Optionally, the switching unit 50 is a switch thin film transistor 50. Optionally, each of the plurality of pixel units 01 comprises only one switching unit (e.g., switch thin film transistor 50). Optionally, each of the plurality of pixel units 01 comprises only two switching units (e.g., two switch thin film transistors 50).

In some embodiments, the at least one data line includes two different data lines, e.g., a first data line 60 and a second data line 70. In some embodiment, the method further includes forming the first data line 60 and the second data line 70. Optionally, the first drive thin film transistor 30 is connected to the first data line 60, and adapted to transmit a signal from the first data line 60 to the bottom emitting organic light emitting diode 10. Optionally, the second drive thin film transistor 40 is connected to the second data line 70, and adapted to transmit a signal from the second data line 70 to the top emitting organic light emitting diode 20.

In some embodiment, the at least one data line includes one data line. The first data line 60 and the second data line 70 are a same data line. In some embodiment, the method further includes forming, a same data line. Optionally, the first drive thin film transistor 30 and the second drive thin film transistor 40 are both connected to a same data line, the first drive thin film transistor 30 is adapted to transmit a signal from the same data line to the bottom emitting organic light emitting diode 10, and the second drive thin film transistor 40 is adapted to transmit a signal from the same data line to the top emitting organic light emitting diode 20.

Each of the bottom emitting organic light emitting diode 10 and the top emitting organic light emitting diode 20 includes two electrodes and an organic material functional layer sandwiched between two electrodes. The bottom emitting organic light emitting diode 10 optionally includes a first electrode, an organic material functional layer and a second electrode. The top emitting organic light emitting diode 20 optionally includes a third electrode, an organic material functional layer and a fourth electrode. The first, second, third, and fourth electrodes, and the organic material functional layer are disposed according to the light emitting directions of the bottom emitting organic light emitting diode 10 and the top emitting organic light emitting diode 20. Optionally, the bottom emitting organic light emitting diode 10 and the top emitting organic light emitting diode 20 further include additional functional layers to ensure their respective light emitting direction.

The organic material functional layer includes a light emitting layer, and may further include an electron transport layer and a hole transport layer. Optionally, the organic material functional layer further includes an electron injection layer between a cathode and the electron transport layer, and/or a hole injection layer between an anode and the hole transport layer, to enhance the efficiency of injection of electrons/holes into the light emitting layer.

The thin film transistors, for example, the first switch thin film transistor 50, the first drive thin film transistor 30 and the second drive thin film transistor 40, include a gate electrode, a gate insulating layer, a semi-conductor active layer, a source electrode and a drain electrode. The thin film transistors can be an N-type thin film transistor or a P-type thin film transistor.

The thin film transistors can be a top gate type thin film transistor or a bottom gate type thin film transistor. Optionally, they may be a non-crystalline silicone thin film transistor, a metal oxide thin film transistor, a low temperature polycrystalline silicone thin film transistor, or an organic thin film transistor.

In some embodiments, the disclosure provides a method of manufacturing an array substrate. In the array substrate manufactured according to the method in some embodiments, the bottom emitting organic light emitting diode 10 and the top emitting organic light emitting diode 20 emit light in different directions, e.g., opposite directions. For example, the bottom emitting organic light emitting diode 10 emits light from a first side of the base substrate, and the top emitting organic light emitting diode 20 emits light from a second side of the base substrate. Optionally, the second side is a side opposite to the first side. In some embodiments, the bottom emitting organic light emitting diode 10 emits light and is viewed through the base substrate upon which it is based. In some embodiments, the top emitting organic light emitting diode 20 primarily emits light and is viewed through the side opposite to the base substrate. Optionally, the top emitting organic light emitting diode 20 does not primarily emit light through the base substrate. For example, in a dual-side display device including such an array substrate manufactured according to the method in some embodiments, the first drive thin film transistor 30 transmits drive signals to the bottom emitting organic light emitting diode 10, an image is displayed on one side of the display device. The second drive thin film transistor 40 transmits drive signals to the top emitting organic light emitting diode 20, an image is displayed on the opposite side of the display device.

Referring to FIGS. 2-4, the drain electrode of the first drive thin film transistor 30 in the embodiments is connected to a first electrode of the bottom emitting organic light emitting diode, and the source electrode of the first drive thin film transistor 30 in the embodiments is connected to the first data line 60. Optionally, the drain electrode of the second drive thin film transistor 40 is connected to a third electrode of the top emitting organic light emitting diode 20, and the source electrode of the second drive thin film transistor 40 is connected to the second data line 70. Optionally, the at least one (e.g., one, two or more switch thin film transistor 50 is adapted to provide gate electrode signals to the first drive thin film transistor 30 and the second drive thin film transistor 40. Optionally, the array substrate 01 further comprises a third data line 80 connected to a source electrode of the switch thin film transistor 50, and a first gate line 90 connected to a gate electrode of the at least one switch thin film transistor 50.

In some embodiments, the number of switch thin film transistors is one (i.e., the first switch thin film transistor). Correspondingly, the gate electrode of the first switch thin film transistor 50 is connected to only one gate line, i.e., the gate line 90. The source electrode of the first thin film electrode 50 is connected to only one data line, i.e., the third data line 80. The drain electrode of the first switch thin film transistor 50 is connected to the gate electrodes of both the first drive thin film transistor 30 and the second drive thin film transistor 40.

Accordingly, one switch thin film transistor 50 can simultaneously control (e.g., turn on or turn off) the first drive thin film transistor 30 and the second drive thin film transistor 40 in a same pixel unit, thereby realize dual-side display in a display panel having the array substrate. Optionally, the first drive thin film transistor 30 and the second drive thin film transistor 40 connect to the first data line 60 and the second data line 70, respectively. Therefore, two sides of the display panel may display a same image or two different images. Further, the switch thin film transistors 50 from different pixel units of a single row in an array substrate connects to a same gate line 90.

Accordingly, one switch thin film transistor 50 can simultaneously control (e.g., turn on or turn off) the first drive thin film transistor 30 and the second drive thin film transistor 40 in a same pixel unit, thereby realize dual-side display in a display panel having the array substrate. Optionally, the first drive thin film transistor 30 and the second drive thin film transistor 40 connect to the first data line 60 and the second data line 70, respectively. Therefore, two sides of the display panel may display a same image or two different images. Further, the switch thin film transistors 50 from different pixel units of a single row in an array substrate connects to a same gate line 90.

In some embodiments, the first data line 60 and the second data line 70 are dispose on two sides of the pixel unit, the first data line 60 is proximal to the first drive thin film transistor 30 and the second data line 70 is proximal to the second drive thin film transistor 40. Optionally, the third data line 80 can be proximal to either the first data line 60 or the second data line 70. Optionally, the first data line 60 and the second data line 70 are substantially parallel to each other and formed in a same patterning process as the source electrodes and the drain electrodes of the first switch thin film transistor 50, the first drive thin film transistor 30 and the second drive thin film transistor 40. Optionally, the third data line 80 is spaced apart by a first insulating layer from the first data line 60 and the second data line 70. Optionally, the third data line 80 is on a same layer as the first data line 60 and the second data line 70. Optionally, the first gate line 90 is formed in a same patterning process as the gate electrodes of the first switch thin film transistor 50, the first drive thin film transistor 30 and the second drive thin film transistor 40.

In some embodiments, the third data line 80 is connected to the source electrode of the first switch thin film transistor 50 through a via in the first insulating layer. The first data line 60 and the first drive thin film transistor 30 is directly connected. The second data line 70 and the second drive thin film transistor 40 is directly connected.

In some embodiments, the first gate line 90 is formed in a same patterning process (i.e., on a same layer) as the gate electrodes of the first switch thin film transistor 50, the first drive thin film transistor 30 and the second drive thin film transistor 40. Similarly, the first data line 60 and the second data line 70 can be formed in a same patterning process (i.e., on a same layer) as the source electrodes and the drain electrodes of the first switch thin film transistor 50, the first drive thin film transistor 30 and the second drive thin film transistor 40. Subsequently, the first insulating layer can be formed. In addition, all active layers of the first switch thin film transistor 50, the first drive thin film transistor 30 and the second drive thin film transistor 40 may be formed in a same patterning process. All the data lines (e.g., the third data line 80) which are connected to the source electrodes of the switch thin film transistors (e.g., the first switch thin film transistor 50) can be formed in a same patterning process. The third data line 80 can be connected to the source electrode of the first switch thin film transistor 50 through a via in the first insulating layer.

FIG. 3 is a schematic view of a connection of various components in a pixel unit of an array substrate in another embodiment. Referring to FIG. 3, the array substrate in the embodiment includes a first switch thin film transistor 50 and a second switch thin film transistor 51. The gate electrode of the first switch thin film transistor 50 is connected to the first gate line 90. The gate electrode of the second switch thin film transistor 51 is connected to a second gate line 91. The source electrode of the first switch thin film transistor 50 is connected to the third data line 80. The source electrode of the second switch thin film transistor 51 is connected to the fourth data line 81. The drain electrode of the first switch thin film transistor 50 is connected to a gate electrode of the first drive thin film transistor 30. The drain electrode of the second switch thin film transistor 51 is connected to a gate electrode of the second drive thin film transistor 40.

As discussed above, the gate electrode of the first switch thin film transistor 50 and the second switch thin film transistor 51 can be connected to different gate lines or a same gate line. Optionally, the gate electrode of the first switch thin film transistor 50 is connected to the first gate line 90, and the gate electrode of the second switch thin film transistor 51 is connected to the second gate line 91. Optionally, when the pixel unit has two switch thin film transistors, the gate electrode of the first switch thin film transistor 50 and the gate electrode of the second switch thin film transistor 51 are both connected to a same gate line.

Referring to FIG. 3, the first switch thin film transistor 50 is connected to and adapted to control the first drive thin film transistor 30. The second switch thin film transistor 51 is connected to and adapted to control the second drive thin film transistor 40. Accordingly, the first drive thin film transistor 30 and the second drive thin film transistor 40 in a same pixel unit can be individually and separately controlled (e.g., turned on or turned off) by two switch thin film transistors 50 and 51, thereby realize dual-side display in a display panel having the array substrate. In such a display panel, two sides can display images at the same time. Alternatively, one side can display images while the other side does not. Optionally, the first drive thin film transistor 30 and the second drive thin film transistor 40 connect to the first data line 60 and the second data line 70, respectively. Therefore, two sides of the display panel may display a same image or two different images. Further, the switch thin film transistors 50 from different pixel units of a single row in an array substrate connects to a same gate line 90. The switch thin film transistors 51 from different pixel units of a single row in an array substrate connects to a same gate line 91. In FIG. 3, the gate line 90 is a different gate line from the gate line 91. As discussed above, in some embodiments, the first gate line 90 and the second gate line 91 can be a same gate line.

In some embodiments, the first data line 60 and the second data line 70 are disposed on two sides of the pixel unit. Optionally, the first data line 60 is proximal to the first drive thin film transistor 30 and the second data line 70 is proximal to the second drive thin film transistor 40. Optionally, the third data line 80 is proximal to the first data line 60, and the fourth data line 81 is proximal to the second data line 70. Optionally, the first data line 60 and the second data line 70 are substantially parallel to each other and formed in a same patterning process (i.e., on a same layer) as the source electrodes and the drain electrodes of the first switch thin film transistor 50, the second switch thin film transistor 51, the first drive thin film transistor 30 and the second drive thin film transistor 40. Optionally, the third data line 80 and the fourth data line 81 are formed in a same patterning process (i.e., on a same layer). Optionally, the third data line 80 and the fourth data line 81 are spaced apart by a first insulating layer from the first data line 60 and the second data line 70. Optionally, the first gate line 90 is spaced apart by a second insulating layer from the second gate line 70. Optionally, the first gate line 90 is on a same layer as the second gate line 70. Optionally, the first gate line 90 is formed in a same patterning process (i.e., on a same layer) as the gate electrodes of the first switch thin film transistor 50, the second switch thin film transistor 51, the first drive thin film transistor 30 and the second drive thin film transistor 40.

In some embodiments, the third data line 80 is connected to the source electrode of the first switch thin film transistor 50 through a via in the first insulating layer. The first data line 60 and the first drive thin film transistor 30 is directly connected. The second data line 70 and the second drive thin film transistor 40 is directly connected. The gate electrode of the first switch thin film transistor 50 in a pixel unit is directly connected to the first gate line 90 formed in a same patterning process (i.e., on a same layer). The gate electrode of the second switch thin film transistor 51 in a pixel unit is connected to the second gate line 91 through a via in the second insulating layer.

In some embodiments, the first gate line 90 is formed in a same patterning process (i.e., on a same layer) as the gate electrodes of the first switch thin film transistor 50, the second switch thin film transistor 51, the first drive thin film transistor 30 and the second drive thin film transistor 40. The first gate line 90 is connected to the gate electrode of the first switch thin film transistor 50. The method then includes forming a second insulting layer, followed by forming the second gate line 91 which is connected to the gate electrode of the first switch thin film transistor 51 through a via in the second insulating layer. The method further includes forming the first data lines 60, the second data lines 70, the source electrodes and the drain electrodes of the first switch thin film transistor 50, the second switch thin film transistor 51, the first drive thin film transistor 30 and the second drive thin film transistor 40 in a same patterning process (i.e., on a same layer). The method also includes forming the first insulating layer having a via. In addition, all active layers of the first switch thin film transistor 50, the second switch thin film transistor 51, the first drive thin film transistor 30 and the second drive thin film transistor 40 may be formed in a same patterning process. All the data lines (e.g., the third data line 80, and the fourth data line 81) which are connected to the source electrodes of the switch thin film transistors (e.g., the first switch thin film transistor 50 and the second switch thin film transistor 51) can be formed in a same patterning process. The third data line 80 can be connected to the source electrode of the first switch thin film transistor 50 through a via in the first insulating layer. The fourth data line 81 can be connected to the source electrode of the second switch thin film transistor 51 through a via in the first insulating layer.

In some embodiments, the step of forming a bottom emitting organic light emitting diode 10 and a top emitting organic light emitting diode 20 in each of the plurality of pixel units 01 includes sequentially forming a transparent first electrode 101, a first organic material function layer, a semi-transparent second electrode 102 in a first area of each of the plurality of pixel units 01; and sequentially forming a transparent third electrode 201, a second organic material function layer, a semi-transparent fourth electrode 202 in a second area of each of the plurality of pixel units 01. Optionally, the second electrode 102 and the fourth electrode 202 are made of metal material. Optionally, the step further includes forming a reflective layer 203 on a side of the third electrode 201 distal to the fourth electrode 202 in the second area.

Optionally, the transparent electrodes (e.g., the first electrode 101 and the third electrode 201) can be made of a high work function transparent material such as indium tin oxide and indium zinc oxide. Optionally, a metal electrode can be made of a low work function metal material such as silver. Optionally, the second electrode 102 or the fourth electrode 202 can be a semi-transparent metal layer which is relatively thin (such as Al, Cu, Mo, Ti, Pt, Ir, Ni, Cr, Ag, Au, W, or alloys thereof), or a semi-transparent layer including metal and transparent conductive materials (such as indium tin oxide (ITO), indium zinc oxide (IZO), aluminum zinc oxide (AZO), or zinc oxide (ZnO). Light transmission rate of a semi-transparent can be adjusted by, e.g., using a thin metal layer having different a thickness.

In some embodiments, the method includes forming the reflective layer 203 in the second area; forming the transparent first electrode 101 in the first area and the transparent third electrode 201 in the second area in a same patterning process; forming the organic material functional layer on top of the first electrode 101 and the third electrode 201 by thermal evaporation; forming the second electrode 102 and the fourth electrode 202 by thermal evaporation. Optionally, the second electrode 102 and the fourth electrode 202 can be integrally formed.

In another aspect, the present disclosure further provides a display device having the array substrate described herein and an encapsulation layer. The encapsulation layer can be a thin film or a substrate.

The display device can be of any suitable type, an electronic paper display device, an OLED display panel, a mobile phone, an AMOLED display device, an AMOLED television, a laptop, a computer, PDA, GPS, an in-vehicle display device, a projection display, a camera, a video recorder, a digital camera, an electronic watch, a calculator, a meter, a public display, a virtual display, and so on.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modification as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component explicitly recited in the following claims.

What is claimed is:

1. An array substrate, comprising:
    a pixel unit comprising a bottom emitting organic light emitting diode, a top emitting organic light emitting diode, a first drive thin film transistor, and a second drive thin film transistor;
    at least one switch thin film transistor connected to, and configured to control, the first drive thin film transistor and the second drive thin film transistor;
    at least one data line, the first drive thin film transistor connected to one of the at least one data line, and the second drive thin film transistor connected to one of the at least one data line; and
    a third data line connected to a source electrode of the at least one switch thin film transistor, the third data line being different from the at least one data line;
    wherein the first drive thin film transistor is connected to the bottom emitting organic light emitting diode for driving the bottom emitting organic light emitting diode to emit light; and
    the second drive thin film transistor is connected to the top emitting organic light emitting diode for driving the top emitting organic light emitting diode to emit light.

2. The array substrate of claim 1, wherein the first drive thin film transistor is configured to transmit a signal from one of the at least one data line to the bottom emitting organic light emitting diode, and the second drive thin film transistor is configured to transmit a signal from one of the at least one data line to the top emitting organic light emitting diode.

3. The array substrate of claim 2, wherein the at least one data line comprises a first data line and a second data line, the first drive thin film transistor is connected to the first data line, and configured to transmit a signal from the first data line to the bottom emitting organic light emitting diode, and the second drive thin film transistor is connected to the second data line, and configured to transmit a signal from the second data line to the top emitting organic light emitting diode.

4. The array substrate of claim 3, further comprising:
    at least one gate line connected to a gate electrode of the at least one switch thin film transistor;
    wherein a drain electrode of the first drive thin film transistor is connected to a first electrode of the bottom emitting organic light emitting diode, a source electrode of the first drive thin film transistor is connected to the first data line;
    a drain electrode of the second drive thin film transistor is connected to a third electrode of the top emitting organic light emitting diode, a source electrode of the second drive thin film transistor is connected to the second data line; and
    the at least one switch thin film transistor is configured to provide gate electrode signals to the first drive thin film transistor and the second drive thin film transistor.

5. The array substrate of claim 4, wherein the at least one switch thin film transistor comprises a first switch thin film transistor, the first switch thin film transistor is connected to, and configured to control, the first drive thin film transistor and the second drive thin film transistor, the at least one gate line comprises a first gate line;
    the gate electrode of the first switch thin film transistor is connected to the first gate line;
    the source electrode of the first switch thin film transistor is connected to the third data line; and
    the drain electrode of the first switch thin film transistor is connected to a gate electrode of the first drive thin film transistor and a gate electrode of the second drive thin film transistor.

6. The array substrate of claim 5, wherein the first data line and the second data line are dispose on two sides of the pixel unit, the first data line is proximal to the first drive thin film transistor and the second data line is proximal to the second drive thin film transistor;
    the third data line is proximal to the first data line or the second data line;
    the first data line and the second data line are substantially parallel to each other and on a same layer as the source electrodes and the drain electrodes of the first switch thin film transistor, the first drive thin film transistor and the second drive thin film transistor; and
    the first gate line is on a same layer as the gate electrodes of the first switch thin film transistor, the first drive thin film transistor and the second drive thin film transistor.

7. The array substrate of claim 4, wherein the at least one switch thin film transistor comprises a first switch thin film transistor and a second switch thin film transistor, the first switch thin film transistor is connected to, and configured to control, the first drive thin film transistor, the second switch thin film transistor is connected to, and configured to control, the second drive thin film transistor;
    the gate electrode of the first switch thin film transistor and the gate electrode of the second switch thin film transistor are connected to the at least one gate line;
    the source electrode of the first switch thin film transistor is connected to the third data line, the source electrode of the second switch thin film transistor is connected to a fourth data line; and
    the drain electrode of the first switch thin film transistor is connected to a gate electrode of the first drive thin film transistor, the drain electrode of the second switch thin film transistor is connected to a gate electrode of the second drive thin film transistor.

8. The array substrate of claim 7, wherein the at least one gate line comprises a first gate line and a second gate line, the gate electrode of the first switch thin film transistor is connected to the first gate line, and the gate electrode of the second switch thin film transistor is connected to the second gate line.

9. The array substrate of claim 8, wherein the first data line and the second data line are dispose on two sides of the pixel unit, the first data line is proximal to the first drive thin film transistor and the second data line is proximal to the second drive thin film transistor;
the third data line is proximal to the first data line, the fourth data line is proximal to the second data line;
the first data line and the second data line are substantially parallel to each other and on a same layer as the source electrodes and the drain electrodes of the first switch thin film transistor, the second switch thin film transistor, the first drive thin film transistor and the second drive thin film transistor;
the third data line and the fourth data line are on a same layer; and
the first gate line is on a same layer as the gate electrodes of the first switch thin film transistor, the second switch thin film transistor, the first drive thin film transistor and the second drive thin film transistor.

10. The array substrate of claim 1, wherein the first electrode of the bottom emitting organic light emitting diode is proximal to the drain electrode of the first drive thin film transistor, a second electrode of the bottom emitting organic light emitting diode is distal to the drain electrode of the first drive thin film transistor, the first electrode is a transparent electrode, and the second electrode is a semi-transparent electrode;
the third electrode of the top emitting organic light emitting diode is proximal to the drain electrode of the second drive thin film transistor, a fourth electrode of the top emitting organic light emitting diode is distal to the drain electrode of the first drive thin film transistor, the third electrode is a transparent electrode, and the fourth electrode is a semi-transparent electrode; and
the top emitting organic light emitting diode further comprises a reflective layer on a side of the third electrode distal to the fourth electrode.

11. A display device comprising an array substrate of claim 1.

12. A method of manufacturing an array substrate comprising a pixel unit, the method comprising:
forming a bottom emitting organic light emitting diode, a top emitting organic light emitting diode, a first drive thin film transistor, a second drive thin film transistor and at least one switch thin film transistor in the pixel unit;
forming at least one data line, the first drive thin film transistor formed to be connected to one of the at least one data line, and the second drive thin film transistor formed to be connected to one of the at least one data line; and
forming a third data line connected to a source electrode of the at least one switch thin film transistor, the third data line being different from the at least one data line;
wherein the first drive thin film transistor is formed to be connected to the bottom emitting organic light emitting diode for driving the bottom emitting organic light emitting diode to emit light;
the second drive thin film transistor is formed to be connected to the top emitting organic light emitting diode for driving the top emitting organic light emitting diode to emit light; and the at least one switch thin film transistor is formed to be connected to, and configured to control, the first drive thin film transistor and the second drive thin film transistor.

13. The method of claim 12, wherein the first drive thin film transistor is formed to be configured to transmit a signal from the at least one data line to the bottom emitting organic light emitting diode, and the second drive thin film transistor is formed to be configured to transmit a signal from the at least one data line to the top emitting organic light emitting diode.

14. The method of claim 13, wherein the at least one data line comprises a first data line and a second data line;
the first drive thin film transistor is formed to be connected to the first data line, and configured to transmit a signal from the first data line to the bottom emitting organic light emitting diode, and the second drive thin film transistor is formed to be connected to the second data line, and configured to transmit a signal from the second data line to the top emitting organic light emitting diode.

15. The method of claim 14, further comprising
forming at least one gate line connected to a gate electrode of the at least one switch thin film transistor;
wherein a drain electrode of the first drive thin film transistor is formed to be connected to a first electrode of the bottom emitting organic light emitting diode, a source electrode of the first drive thin film transistor is formed to be connected to the first data line;
a drain electrode of the second drive thin film transistor is formed to be connected to a third electrode of the top emitting organic light emitting diode, a source electrode of the second drive thin film transistor is formed to be connected to the second data line; and
the at least one switch thin film transistor is configured to provide gate electrode signals to the first drive thin film transistor and the second drive thin film transistor.

16. The method of claim 15, wherein the at least one switch thin film transistor comprises a first switch thin film transistor, the first switch thin film transistor is formed to be connected to, and configured to control, the first drive thin film transistor and the second drive thin film transistor, and the at least one gate line comprises a first gate line;
the gate electrode of the first switch thin film transistor is formed to be connected to the first gate line;
the source electrode of the first switch thin film transistor is formed to be connected to the third data line; and
the drain electrode of the first switch thin film transistor is formed to be connected to a gate electrode of the first drive thin film transistor and a gate electrode of the second drive thin film transistor.

17. The method of claim 16, wherein the first data line and the second data line are dispose on two sides of the pixel unit, the first data line is formed proximal to the first drive thin film transistor and the second data line is formed proximal to the second drive thin film transistor;
the third data line is formed proximal to the first data line or the second data line;
the first data line and the second data line are substantially parallel to each other and formed in a same patterning process as the source electrodes and the drain electrodes of the first switch thin film transistor, the first drive thin film transistor and the second drive thin film transistor; and
the first gate line is formed in a same patterning process as the gate electrodes of the first switch thin film transistor, the first drive thin film transistor and the second drive thin film transistor.

18. The method of claim 15, wherein the at least one switch thin film transistor comprises a first switch thin film transistor and a second switch thin film transistor, the first switch thin film transistor is formed to be connected to, and configured to control, the first drive thin film transistor, the second switch thin film transistor is formed to be connected to, and configured to control, the second drive thin film transistor;

the gate electrode of the first switch thin film transistor and the gate electrode of the second switch thin film transistor are formed to be connected to the at least one gate line;

the source electrode of the first switch thin film transistor is formed to be connected to the third data line, the source electrode of the second switch thin film transistor is formed to be connected to the fourth data line; and the drain electrode of the first switch thin film transistor is formed to be connected to a gate electrode of the first drive thin film transistor, the drain electrode of the second switch thin film transistor is formed to be connected to a gate electrode of the second drive thin film transistor.

19. The method of claim 18, wherein the at least one gate line comprises a first gate line and a second gate line, the gate electrode of the first switch thin film transistor is formed to be connected to the first gate line, and the gate electrode of the second switch thin film transistor is formed to be connected to the second gate line.

20. The method of claim 19, wherein the first data line and the second data line are dispose on two sides of the pixel unit, the first data line is formed proximal to the first drive thin film transistor and the second data line is formed proximal to the second drive thin film transistor;

the third data line is formed proximal to the first data line, the fourth data line is formed proximal to the second data line;

the first data line and the second data line are substantially parallel to each other and formed in a same patterning process as the source electrodes and the drain electrodes of the first switch thin film transistor, the second switch thin film transistor, the first drive thin film transistor and the second drive thin film transistor;

the third data line and the fourth data line are formed in a same patterning process as the first data line and the second data line; and the first gate line is formed in a same patterning process as the gate electrodes of the first switch thin film transistor, the second switch thin film transistor, the first drive thin film transistor and the second drive thin film transistor.

* * * * *